US009929246B1

(12) United States Patent
Cheng et al.

(10) Patent No.: US 9,929,246 B1
(45) Date of Patent: Mar. 27, 2018

(54) FORMING AIR-GAP SPACER FOR VERTICAL FIELD EFFECT TRANSISTOR

(71) Applicant: INTERNATIONAL BUSINESS MACHINES CORPORATION, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/413,558

(22) Filed: Jan. 24, 2017

(51) Int. Cl.
| | |
|---|---|
| *H01L 21/00* | (2006.01) |
| *H01L 21/84* | (2006.01) |
| *H01L 21/336* | (2006.01) |
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/49* | (2006.01) |
| *H01L 21/768* | (2006.01) |
| *H01L 29/43* | (2006.01) |
| *H01L 29/66* | (2006.01) |
| *H01L 29/08* | (2006.01) |
| *H01L 29/78* | (2006.01) |

(52) U.S. Cl.
CPC ...... *H01L 29/4991* (2013.01); *H01L 21/7682* (2013.01); *H01L 29/0847* (2013.01); *H01L 29/435* (2013.01); *H01L 29/66666* (2013.01); *H01L 29/7827* (2013.01)

(58) Field of Classification Search
CPC .............. H01L 21/764; H01L 29/4991; H01L 29/0649; H01L 29/0676
USPC .................................. 257/329; 438/157, 303
See application file for complete search history.

(56) References Cited

U.S. PATENT DOCUMENTS

| | | | |
|---|---|---|---|
| 5,914,519 | A | 6/1999 | Chou et al. |
| 8,216,909 | B2 | 7/2012 | Abadeer et al. |
| 9,006,066 | B2 | 4/2015 | Chi et al. |
| 9,029,930 | B2 | 5/2015 | Kelly et al. |

(Continued)

OTHER PUBLICATIONS

Kawasaki et al., "Challenges and Solutions of FinFET Integration in an SRAM Cell and a Logic Circuit for 22 nm node and beyond", 2009 IEEE International Electron Devices Meeting. Dec. 7-9, 2009. pp. 1-4.

*Primary Examiner* — David S Blum
(74) *Attorney, Agent, or Firm* — Tutunjian & Bitetto, P.C.; David M. Quinn (57) ABSTRACT

A method is presented for forming a semiconductor structure. The method includes forming a fin over a bottom source/drain region, forming a high-k metal gate (HKMG) adjacent the fin, forming an epitaxial layer over the fin such that at least one gap region is defined adjacent the HKMG, and forming a top source/drain region over the epitaxial layer and the at least one gap region. A hard mask is deposited before the epitaxial layer to cover the fin and the HKMG. An inter-level dielectric (ILD) oxide is deposited adjacent the hard mask. The hard mask is etched to expose a top region of the fin to receive the epitaxial layer. At least one gap region is defined adjacent top sidewalls of the fin.

20 Claims, 4 Drawing Sheets

(56) References Cited

U.S. PATENT DOCUMENTS

| | | |
|---|---|---|
| 9,252,233 B2 | 2/2016 | Hsiao et al. |
| 9,299,835 B1 | 3/2016 | Anderson et al. |
| 9,337,306 B2 | 5/2016 | Peng et al. |
| 9,368,572 B1 * | 6/2016 | Cheng ................ H01L 29/7827 |
| 9,425,280 B2 * | 8/2016 | Cai ........................ H01L 29/78 |
| 2012/0276711 A1 | 11/2012 | Yoon et al. |

* cited by examiner

FORMING AIR-GAP SPACER FOR VERTICAL FIELD EFFECT TRANSISTOR

BACKGROUND

Technical Field

The present invention relates generally to semiconductor devices, and more specifically, to forming an air-gap spacer for a vertical field effect transistor (VFET).

Description of the Related Art

A fin metal-oxide-semiconductor field effect transistor (finMOSFET or FinFET) can provide solutions to metal-oxide-semiconductor field effect transistor (MOSFET) scaling issues at and below, for example, the 22 nanometer (nm) node of semiconductor technology. A FinFET includes at least one narrow semiconductor fin (e.g., less than 30 nm wide) gated on at least two opposing sides of each of the at least one semiconductor fin. FinFET structures can, for example, typically be formed on either a semiconductor-on-insulator (SOI) substrate or a bulk semiconductor substrate.

A feature of a FinFET is a gate electrode located on at least two sides of the channel formed along the longitudinal direction of the fin. Due to the feature of full depletion in the fin structure, the increased number of sides (e.g., two or three) on which the gate electrode controls the channel of the FinFET enhances the controllability of the channel in a FinFET compared to a planar MOSFET. The improved control of the channel, among other things, allows smaller device dimensions with less short channel effects as well as larger electrical current that can be switched at high speeds.

A typical VFET device includes a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls.

Scaling or otherwise decreasing the dimensions of field effect transistor elements includes decreasing the contacted gate pitch (CPP). Pitch refers to the distance between equivalent points in neighboring features. In a planar FET, the minimal CPP is the sum of gate length, contact width, and twice the thickness of a dielectric spacer. In such devices, the gate length can become the limiting factor for further CPP scaling.

In a vertical FET architecture, the contacted gate pitch can be decoupled from the gate length. However, in a vertical FET the contact to the bottom source/drain (S/D) is formed from the top of the structure such that the bottom S/D contact overlaps the gate. This overlapping configuration creates an undesired parasitic capacitance between adjacent conductive elements.

In view of the foregoing, there is a need for vertical FET architectures and related methods of manufacture that obviate such parasitic capacitance and which are scalable to advanced nodes.

SUMMARY

In accordance with an embodiment, a method is provided for forming a semiconductor structure. The method includes forming a fin over a bottom source/drain region, forming a high-k metal gate (HKMG) adjacent the fin, forming an epitaxial layer over the fin such that at least one gap region is defined adjacent the HKMG, and forming a top source/drain region over the epitaxial layer and the at least one gap region.

In accordance with an embodiment, a method is provided for forming an air-gap spacer for a vertical field effect transistor (VFET). The method includes forming a fin over a substrate, depositing a hard mask over the fin, etching the hard mask to expose a top region of the fin, forming an epitaxial layer over the top region of the fin, and depositing SiN (silicon nitride) to form the air-gap spacer adjacent the epitaxial layer and the top region of the fin.

In accordance with another embodiment, a semiconductor device is provided. The semiconductor device includes a fin formed over a bottom source/drain region, a high-k metal gate (HKMG) formed adjacent the fin, an epitaxial layer formed over the fin such that at least one gap region is defined adjacent the HKMG, and a top source/drain region formed over the epitaxial layer and the at least one gap region.

In one preferred aspect, the fin includes a nitride spacer deposited thereon.

In another preferred aspect, a poly-open chemical polish (POC) liner is deposited over the bottom source/drain region.

In yet another preferred aspect, a hard mask is deposited before the epitaxial layer to cover the fin and the HKMG.

In another preferred aspect, an inter-level dielectric (ILD) oxide is deposited adjacent the hard mask.

In yet another preferred aspect, the hard mask is etched to expose a top region of the fin to receive the epitaxial layer. The hard mask is further etched to expose a top surface of the HKMG.

In one preferred aspect, SiN (silicon nitride) is deposited within the recess created by the etching of the hard mask.

In another preferred aspect, the at least one gap region is defined adjacent top sidewalls of the fin.

The advantages of the exemplary embodiments of the present invention include at least decreasing the parasitic capacitance between adjacent metal structures, especially between the gate electrode and contact metallization due to incorporation of the air-gap spacer(s) into the transistor architecture. A SiN deposition disposed over the gate also decreases parasitic capacitance and inhibits electrical shorting between the contact to the gate. Thus, the SiN deposition and CMP (chemical mechanical planarization) can naturally form at least one air gap between the top source/drain epi and the gate, which advantageously reduces parasitic capacitance. The goal is to utilize the fact that the top source/drain epi sits on top of the vertical fin. In this case, when forming the top source/drain epi that is larger than the fin underneath it, at least one air gap is advantageously formed underneath. Therefore, parasitic capacitance between the gate and the top S/D epi for the VFET is reduced by forming air gaps between the top S/D epi and the gate.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

In one or more embodiments, a method is provided for forming a semiconductor structure. The method includes forming a fin over a bottom source/drain region, forming a high-k metal gate (HKMG) adjacent the fin, forming an epitaxial layer over the fin such that at least one gap region is defined adjacent the HKMG, and forming a top source/drain region over the epitaxial layer and the at least one gap region.

In one or more embodiments, a method is provided for forming an air-gap spacer for a vertical field effect transistor (VFET). The method includes forming a fin over a substrate, depositing a hard mask over the fin, etching the hard mask to expose a top region of the fin, forming an epitaxial layer over the top region of the fin, and depositing SiN (silicon nitride) to form the air-gap spacer adjacent the epitaxial layer and the top region of the fin.

In one or more embodiments, a semiconductor device is provided. The semiconductor device includes a fin formed over a bottom source/drain region, a high-k metal gate (HKMG) formed adjacent the fin, an epitaxial layer formed over the fin such that at least one gap region is defined adjacent the HKMG, and a top source/drain region formed over the epitaxial layer and the at least one gap region.

The exemplary embodiments of the present invention describe a vertical transistor having air-gap spacers oriented in one or both of horizontal and vertical directions. In embodiments, a vertical transistor has a first air-gap spacer between the top source/drain region and the HKMG positioned adjacent the fin, and a second air-gap spacer between the top source/drain region and the HKMG positioned adjacent the fin. The first air-gap spacer can be oriented horizontally/vertically while the second air-gap spacer can also be oriented vertically/horizontally. Example vertical transistors can include either or both of the first and second air-gap spacers.

Incorporation of the air-gap spacer(s) into the transistor architecture advantageously decreases the parasitic capacitance between adjacent metal structures, especially between the gate electrode and contact metallization. A SiN deposition disposed over the gate also advantageously decreases parasitic capacitance and is useful in inhibiting electrical shorting between the contact to the gate.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

As used herein, the term "fin structure" refers to a semiconductor material, which can be employed as the body of a semiconductor device, in which a gate structure is positioned around the fin structure such that charge flows down the channel on the two sidewalls of the fin structure and optionally along the top surface of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
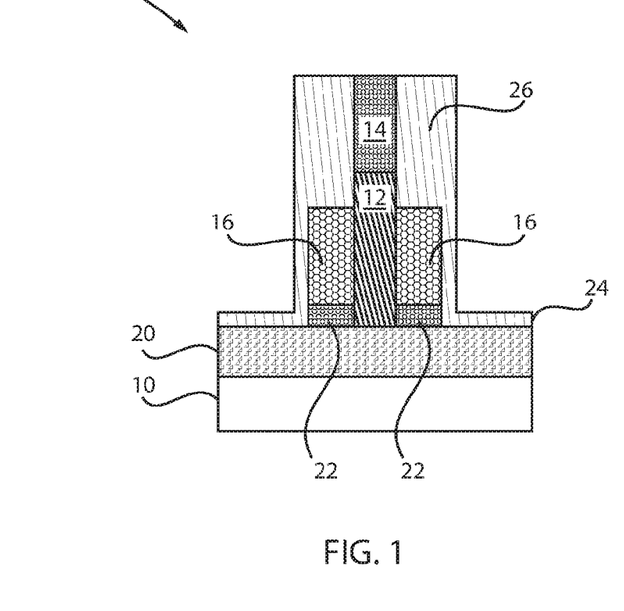
FIG. 1 is a cross-sectional view of a semiconductor structure including a fin over a bottom source/drain region, the fin covered by a hard mask, in accordance with an embodiment of the present invention.

FIG. 1 is a cross-sectional view of a semiconductor structure including a fin over a bottom source/drain region, the fin covered by a hard mask, in accordance with an embodiment of the present invention.

A semiconductor structure 5 includes a semiconductor substrate 10. A bottom source/drain (S/D) layer 20 is deposited/formed over the substrate 10. A fin 12 is formed over the bottom source/drain region 20 and bottom spacers 22 are formed on opposed ends of the fin 12. A poly-open chemical polish (POC) liner 24 is further deposited.

Subsequently, a nitride spacer 14 is deposited over the fin 12. A gate 16 is disposed adjacent the fin 12. The gate 16 can be disposed on opposed ends of the fin 12. The gate 16 can be a high-k metal gate (HKMG). A hard mask 26 is then deposited over the HKMG 16 and the fin 12 and the nitride spacer 14. Stated different, the hard mask 26 covers the exposed top portion/region of the fin 12, as well as the HKMG 16. The hard mask 26 can be flush with the top surface of the nitride spacer 14.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

As used herein, a "semiconductor fin" refers to a semiconductor structure including a portion having a shape of a rectangular parallelepiped. The direction along which a semiconductor fin 12 laterally extends the most is herein referred to as a "lengthwise direction" of the semiconductor fin 12. The height of each semiconductor fin 12 can be in a range from 5 nm to 300 nm, although lesser and greater heights can also be employed. The width of each semiconductor fin 12 can be in a range from 5 nm to 100 nm, although lesser and greater widths can also be employed. In various embodiments, the fins 12 can have a width in the range of about 6 nm to about 20 nm, or can have a width in the range of about 8 nm to about 15 nm, or in the range of about 10 nm to about 12 nm. In various embodiments, the fin 12 can have a height in the range of about 25 nm to about 75 nm, or in the range of about 40 nm to about 50 nm.

Multiple semiconductor fins 12 can be arranged such that the multiple semiconductor fins 12 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each semiconductor fin 12 includes a pair of parallel sidewalls along the lengthwise direction.

In one embodiment, each semiconductor fin 12 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In another embodiment of the present application, each semiconductor fin 12 can be formed utilizing a SIT (sidewall image transfer) process. In a typical SIT process, spacers are formed on sidewall surfaces of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 12 has been formed. In another embodiment, sequential SIT processes can be utilized to form fins with highly scaled fin width and pitches.

In some embodiments, the fins 12 in the plurality of semiconductor fins can have a fin width between 5 nm and 10 nm. The combination of the fin width and the width of the trough equals, in embodiments, the fin pitch. The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials they are made of.

The block mask 26 can comprise soft and/or hard mask materials and can be formed using deposition, photolithography and etching. In one embodiment, the block mask 26 comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 100 nm to 300 nm.

The block mask 26 can comprise soft and/or hard mask materials and can be formed using deposition, photolithography and etching. In one embodiment, the block mask 26 is a hard mask composed of a nitride-containing material, such as silicon nitride (SiN). It is noted that it is not intended that the block mask be limited to only silicon nitride, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsequioxanes, siloxanes, and boron phosphate silicate glass (BPSG).

In one embodiment, a block mask comprising a hard mask material can be formed by blanket depositing a layer of hard mask material, providing a patterned photoresist atop the layer of hard mask material, and then etching the layer of hard mask material to provide a block mask protecting at least one portion of the dummy gate. A patterned photoresist can be produced by applying a blanket photoresist layer to the surface of the dummy gate, exposing the photoresist layer to a pattern of radiation, and then developing the pattern into the photoresist layer utilizing resist developer. Etching of the exposed portion of the block mask can include an etch chemistry for removing the exposed portion of the hard mask material and having a high selectivity to at least the block mask. In one embodiment, the etch process can be an anisotropic etch process, such as reactive ion etch (RIE). In another embodiment, the replacement gate can be formed by utilizing the SIT patterning and etching process described above.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

In various embodiments, bottom spacers 22 are formed by, e.g., an RIE etch. The spacers 22 can be, e.g., a nitride film. In an embodiment, the spacers 22 can be an oxide, for example, silicon oxide (SiO), a nitride, for example, a silicon nitride (SiN), or an oxynitride, for example, silicon oxynitride (SiON). In an embodiment, the spacers 22 can be, e.g., SiOCN, SiBCN, or similar film types. The spacers 22 can also be referred to as a non-conducting dielectric layer.

In some exemplary embodiments, the spacers 22 can include a material that is resistant to some etching processes such as, for example, HF chemical etching or chemical oxide removal etching.

In one or more embodiments, the spacers 22 can have a thickness in the range of about 3 nm to about 10 nm, or in the range of about 3 nm to about 5 nm.

In various embodiments, the HKMG 16 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In various embodiments, the HKMG 16 can have a thickness in the range of about 1.5 nm to about 2.5 nm.

Figure 2:
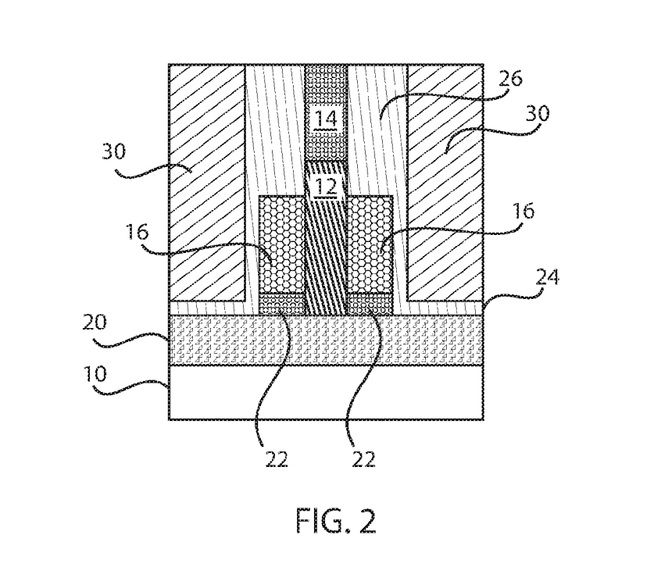
FIG. 2 is a cross-sectional view of the semiconductor structure of FIG. 1 where an inter-level dielectric (ILD) oxide fill takes place, in accordance with an embodiment of the present invention.

FIG. 2 is a cross-sectional view of the semiconductor structure of FIG. 1 where an inter-level dielectric (ILD) oxide fill takes place, in accordance with an embodiment of the present invention.

In various embodiments, an oxide gap fill takes place. The ILD oxide 30 is planarized. The ILD oxide 30 fills the remaining gap or recess between the fins 12. The ILD oxide 30 extends to a top surface of the nitride spacer 14.

In various embodiments, the height of the ILD oxide fill 30 can be reduced by chemical-mechanical polishing (CMP) and/or etching. Therefore, the planarization process can be provided by CMP. Other planarization process can include grinding and polishing. "Planarization" is a material removal process that employs at least mechanical forces, such as frictional media, to produce a substantially two-dimensional surface. A planarization process can include chemical mechanical polishing (CMP) or grinding. Chemical mechanical polishing (CMP) is a material removal process that uses both chemical reactions and mechanical forces to remove material and planarize a surface.

In one or more embodiments, the ILD oxide 30 can have a height in the range of about 20 nm to about 200 nm.

The ILD 30 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 30 include any of the aforementioned materials in porous form, or in a form that changes during processing to or from being porous and/or permeable to being non-porous and/or non-permeable.

In various embodiments, the top sections formed over the structure are removed by, e.g., CMP. Therefore, the planarization process can be provided by CMP. Other planarization process can include grinding and polishing.

Figure 3:
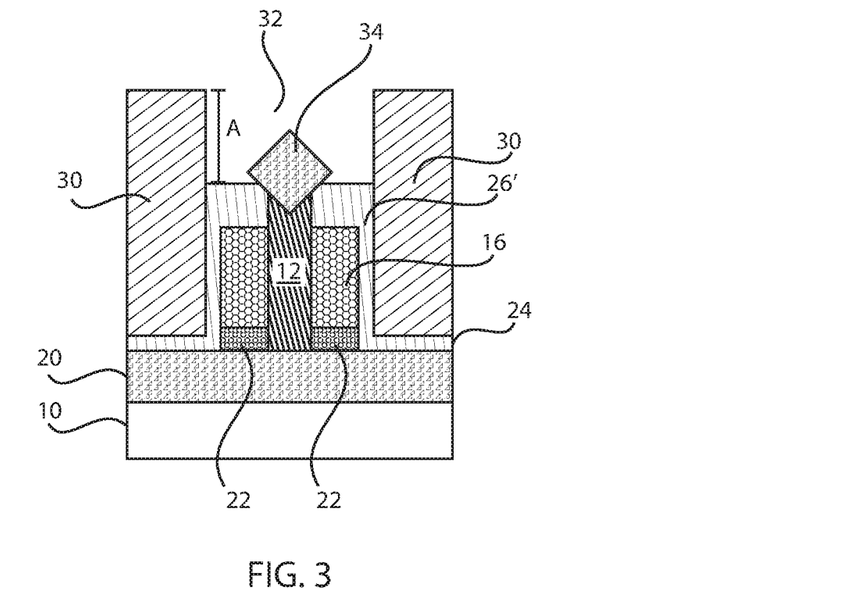
FIG. 3 is a cross-sectional view of the semiconductor structure of FIG. 2 where the hard mask is etched and an epitaxial layer is deposited over a top region of the fin, in accordance with an embodiment of the present invention.

FIG. 3 is a cross-sectional view of the semiconductor structure of FIG. 2 where the hard mask is etched and an epitaxial layer is deposited over a top region of the fin, in accordance with an embodiment of the present invention.

In various embodiments, the hard mask 26 is etched by a distance "A" to create a recess 32. The recessed hard mask is designated as 26'. The recess 32 is formed between the ILD sections 30. An epitaxial layer 34 is formed over the top portion of the fin 12. The epitaxial layer 34 sits over the top portion or top section of the fin 12. Additionally, the etching results in the removal of the nitride spacer 14, which was formed over the fin 12. The bottom surface of the epitaxial layer 34 contacts or engages the top portion or section of the remaining hard mask 26'.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 4:
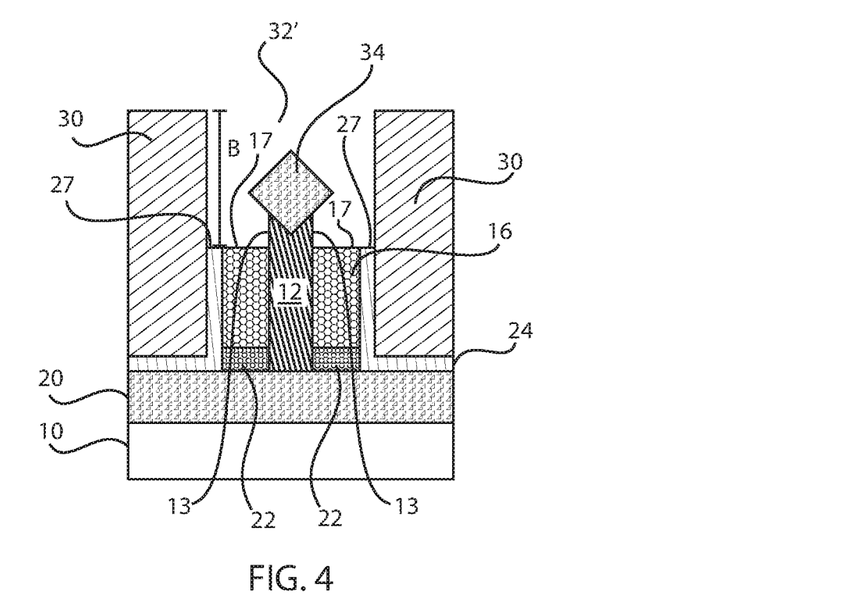
FIG. 4 is a cross-sectional view of the semiconductor structure of FIG. 3 where the hard mask is further etched to expose a top surface of a high-k metal gate (HKMG) formed adjacent the fin, in accordance with an embodiment of the present invention.

FIG. 4 is a cross-sectional view of the semiconductor structure of FIG. 3 where the hard mask is further etched to expose a top surface of a high-k metal gate (HKMG) formed adjacent the fin, in accordance with an embodiment of the present invention.

In various embodiments, the hard mask 26 is further etched to a distance "B," thus creating recess 32'. The further etching of hard mask 26 exposes the top surface 17 of the HKMG 16, as well as the top surface 27 of the hard mask 26 adjacent the HKMG 16. The further etching of the hard mask 26 also exposes the top sidewall surfaces 13 of the fin 12. Thus, the epitaxial layer 34 sits entirely over the top surface of the fin 12. The epitaxial layer 34 does not contact any portion of the hard mask 26'.

Figure 5:
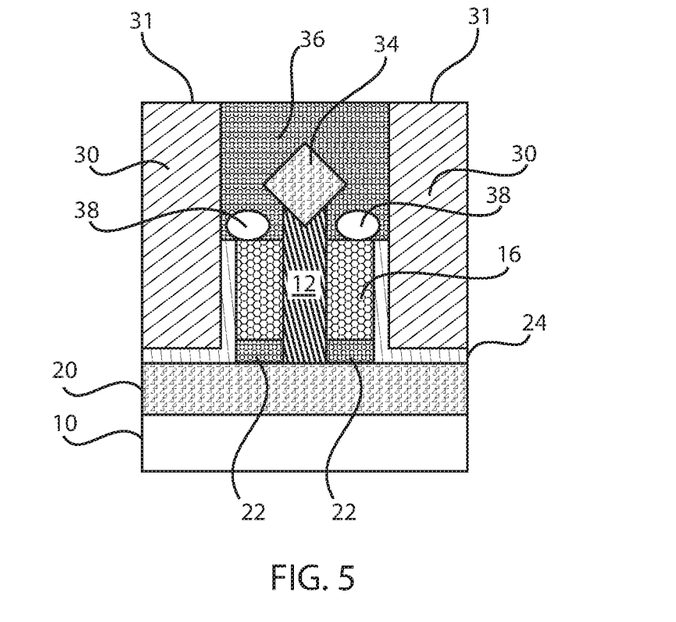
FIG. 5 is a cross-sectional view of the semiconductor device of FIG. 4 where silicon nitride (SiN) is deposited to form at least one air gap adjacent the top region of the fin, in accordance with an embodiment of the present invention.

FIG. 5 is a cross-sectional view of the semiconductor device of FIG. 4 where silicon nitride (SiN) is deposited to form at least one air gap adjacent the top region of the fin, in accordance with an embodiment of the present invention.

In various embodiments, a SiN layer 36 is deposited within the recess 32'. The SiN layer 36 extends up to a top surface 31 of the ILD 30 (by, e.g., CMP). Additionally, at least one air gap 38 is formed adjacent the epitaxial layer 34. The at least one air gap 38 is formed over the HKMG 16. The at least one air gap 38 is further formed adjacent the top region of the fin 12. Specifically, the at least one air gap 38 is formed adjacent the sidewalls 13 of the fin 12.

Figure 6:
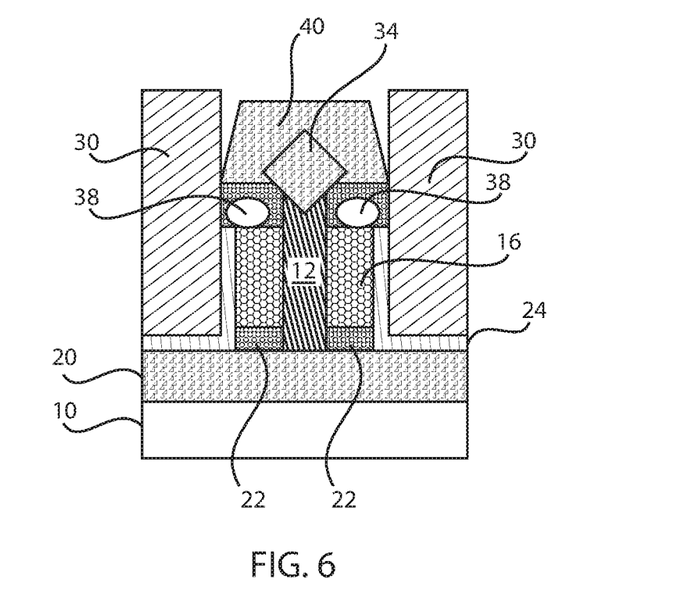
FIG. 6 is a cross-sectional view of the semiconductor device of FIG. 5 where a top source/drain region is formed over the at least one air gap, in accordance with an embodiment of the present invention.

FIG. 6 is a cross-sectional view of the semiconductor device of FIG. 5 where a top source/drain region is formed over the at least one air gap, in accordance with an embodiment of the present invention.

In one or more embodiments, a top source/drain 40 is epitaxially grown after the HKMG 16 is defined in the VFET structure. The deposition of the S/D epi 40 results in the creation of voids or gaps 38 between the HKMG 16 and the S/D epi 40. Therefore, the SiN deposition and CMP can naturally form at least one air gap 38 between the top source/drain epi 40 and the gate 16, which advantageously reduces parasitic capacitance. The goal is to utilize the fact that the top source/drain epi 40 sits on top of the vertical fin 12. In this case, when forming the top source/drain epi 40 that is larger than the fin 12 underneath it, at least one air gap 38 is advantageously formed underneath. Therefore, parasitic capacitance between the gate 16 and the top S/D epi 40 for the VFET is reduced by forming air gaps 38 between the top S/D epi 40 and the gate or HKMG 16.

In another embodiment, the HKMG 16 is defined by a replacement metal gate (RMG) process. It is advantageous and useful to form the epitaxial growth layer 40 after formation of the HKMG 16.

In one or more embodiments, enablement of a higher thermal budget for the top epitaxially grown source/drain region 40 is advantageously achieved, as well as higher epitaxial growth quality, higher in-situ doping, and lower resistance. In another embodiment, multi-Vt is advantageously enabled through a poly open process.

In one or more embodiments, a VFET process is defined which advantageously enables the top source/drain epitaxial region 40 to be formed with a high thermal budget, to minimize defects stemming from epitaxial growth and to minimize sheet resistance. In one or more embodiments, a VFET replacement metal gate (RMG) process is defined that is compatible with tight fin pitches to advantageously enable multi-Vt processing.

In various embodiments, the in-situ doped source/drain 40 is advantageously deposited or formed via epitaxial growth. Depending on how the epitaxial growth develops, it can be necessary to anisotropically etch the epitaxial growth, in order to result in a top surface of the source/drain region 40 that is suitable for subsequent processing.

The doped region 40 can be formed above the vertical fin 12. The dopant can be provided to the doped region(s) 40 (i.e., source/drain region(s)) by ion implantation, and source/drains formed by annealing the doped region(s) 40. In various embodiments, the doped region 40 can be n-doped or p-doped. It should be noted that the source and drain can be interchangeable between the top and bottom locations of a vertical fin, where the doped region in the substrate can act as a source or a drain.

In various embodiments, the bottom source can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain region 40 can include forming an in situ doped epitaxial semiconductor material on the source and drain region portions of the fin structures 12. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain region 40 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain region 40.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the source and drain region 40 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$). In some embodiments, the epitaxial deposition process for forming the epitaxial semiconductor material for the source and drain regions can continue until the epitaxial semiconductor material that is formed on adjacent fin structures contact one another to form merged epitaxial semiconductor material.

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 7:
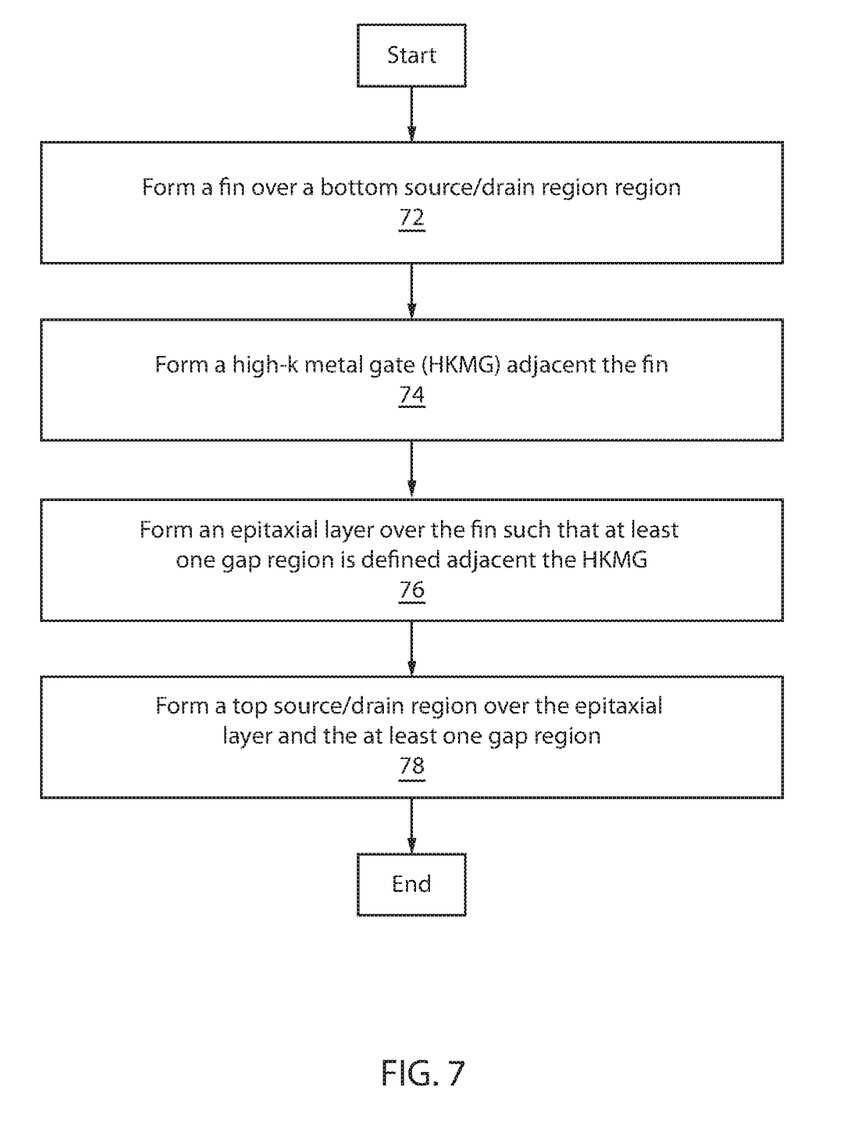
FIG. 7 is a block/flow diagram of an exemplary method for forming at least one air gap for a VFET, in accordance with an embodiment of the present invention.

FIG. 7 is a block/flow diagram of an exemplary method for forming at least one air gap for a VFET, in accordance with an embodiment of the present invention.

At block 72, a fin is formed over a bottom source/drain region.

At block 74, a high-k metal gate (HKMG) is formed adjacent the fin.

At block 76, an epitaxial layer is formed over the fin such that at least one gap region is defined adjacent the HKMG.

At block 78, a top source/drain region is formed over the epitaxial layer and the at least one gap region.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to form at least one air-gap spacer for a vertical field effect transistor (VFET) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor structure, the method comprising:
    forming a fin over a bottom source/drain region;
    forming a high-k metal gate (HKMG) stack adjacent the fin;
    forming an epitaxial layer on the fin, the epitaxial layer having a thickness greater than a thickness of the fin to define at least one gap region adjacent the fin; and
    forming a top source/drain region on the epitaxial layer and over the at least one gap region.

2. The method of claim 1, wherein the fin includes a nitride spacer deposited thereon.

3. The method of claim 1, wherein a poly-open chemical polish (POC) liner is deposited over the bottom source/drain region.

4. The method of claim 1, wherein a hard mask is deposited before the epitaxial layer to cover the fin and the HKMG stack.

5. The method of claim 4, wherein an inter-level dielectric (ILD) oxide is deposited adjacent the hard mask.

6. The method of claim 4, wherein the hard mask is etched to expose a top region of the fin to receive the epitaxial layer.

7. The method of claim 5, wherein the hard mask is further etched to expose a top surface of the HKMG stack.

8. The method of claim 1, wherein silicon nitride (SiN) is deposited within the recess created by the etching of the hard mask.

9. The method of claim 1, wherein the at least one gap region is defined adjacent top sidewalls of the fin.

10. A method of forming an air-gap spacer for a vertical field effect transistor (VFET), the method comprising:
    forming a fin over a substrate;
    depositing a hard mask over the fin;
    etching the hard mask to expose a top region of the fin;
    forming an epitaxial layer on the top region of the fin, the epitaxial layer having a thickness greater than a thickness of the fin to define the air-gap spacer adjacent the fin; and
    depositing silicon nitride (SiN) within a recess created byr the etching of the hard mask.

11. The method of claim 10, wherein a bottom source/drain region is formed over the substrate.

12. The method of claim 11, wherein a poly-open chemical polish (POC) liner is deposited over the bottom source/drain region.

13. The method of claim 10, wherein a top source/drain region is formed on the epitaxial layer after the air-gap spacer is defined.

14. The method of claim 10, wherein a high-k metal gate (HKMG) stack is formed adjacent the fin.

15. The method of claim 10, wherein an inter-level dielectric (ILD) oxide is deposited adjacent the hard mask.

16. The method of claim 10, wherein the SiN is deposited with the recess created by the etching of the hard mask.

17. A semiconductor structure, comprising:
    a fin formed over a bottom source/drain region;
    a high-k metal gate (HKMG) stack formed adjacent the fin;
    an epitaxial layer formed on the fin, the epitaxial layer having a thickness greeter than a thickness of the fin to define at least one gap region adjacent the fin; and
    a top source/drain region formed on the epitaxial layer and over the at least one gap region.

18. The structure of claim 17, wherein a hard mask is deposited before the epitaxial layer to cover the fin and the HKMG stack.

19. The structure of claim 18, wherein the hard mask is etched to expose a top region of the fin to receive the epitaxial layer.

20. The structure of claim 19, wherein the at least one gap region is defined adjacent top sidewalls of the fin.

* * * * *